United States Patent [19]

Kucharek et al.

[11] Patent Number: 4,597,029
[45] Date of Patent: Jun. 24, 1986

[54] SIGNAL CONNECTION SYSTEM FOR SEMICONDUCTOR CHIP

[75] Inventors: Andrzej Kucharek, Mountain View; John Marshall, San Jose; James C. K. Lee, Los Altos; Carlton G. Amdahl, Saratoga; Leo Yuan, San Jose, all of Calif.

[73] Assignee: Trilogy Computer Development Partners, Ltd., Cupertino, Calif.

[21] Appl. No.: 591,342

[22] Filed: Mar. 19, 1984

[51] Int. Cl.⁴ .............................................. H01R 9/00
[52] U.S. Cl. ..................................... 361/407; 357/82; 361/385; 361/408
[58] Field of Search ....................... 361/385, 406–408, 361/412–414, 424; 339/17 LM, 17 M, 112 R; 357/80, 81, 82, 79

[56] References Cited

U.S. PATENT DOCUMENTS

| | | | |
|---|---|---|---|
| 3,312,870 | 4/1967 | Rhoades | 361/407 |
| 3,893,233 | 7/1975 | Glover | 361/407 |
| 4,245,273 | 1/1981 | Feinberg et al. | 361/385 |
| 4,322,778 | 3/1982 | Barbour et al. | 361/414 |
| 4,328,531 | 5/1982 | Nagashima et al. | 361/407 |

OTHER PUBLICATIONS

Ho et al, "Multiple LSI Silicon Chip Modules With Power Buses Composed of Laminated Silicon Sheets With Metallized Upper and Lower Surfaces" IBM Technical Disclosure Bulletin, vol. 22, No. 8A, 1/80 pp. 3410-3411.

Primary Examiner—A. D. Pellinen
Assistant Examiner—Gregory D. Thompson
Attorney, Agent, or Firm—Townsend & Townsend

[57] ABSTRACT

A semiconductor chip having a two-dimensional array of contacts on an exposed face thereof is mounted in a semiconductor chip module. A mechanism for delivering electricity spans the exposed face of the chip to which it is connected and includes interstitial gaps. A conductor board has a surface proximate the electricity delivering mechanism opposite from the chip. The surface of the board has a two-dimensional array of contacts which correspond to at least some of the contacts on the chip. A biasing mechanism extends from the electricity delivering mechanism toward the exposed face of the semiconductor chip and toward the conductor board, and corresponds to the array of contacts on the chip and board. Signal leads pass through the interstitial gaps and have end portions which extend transversely over the biasing means. The end portions of the signal leads are biased against the contacts of the chips and board by the biasing mechanism.

22 Claims, 20 Drawing Figures

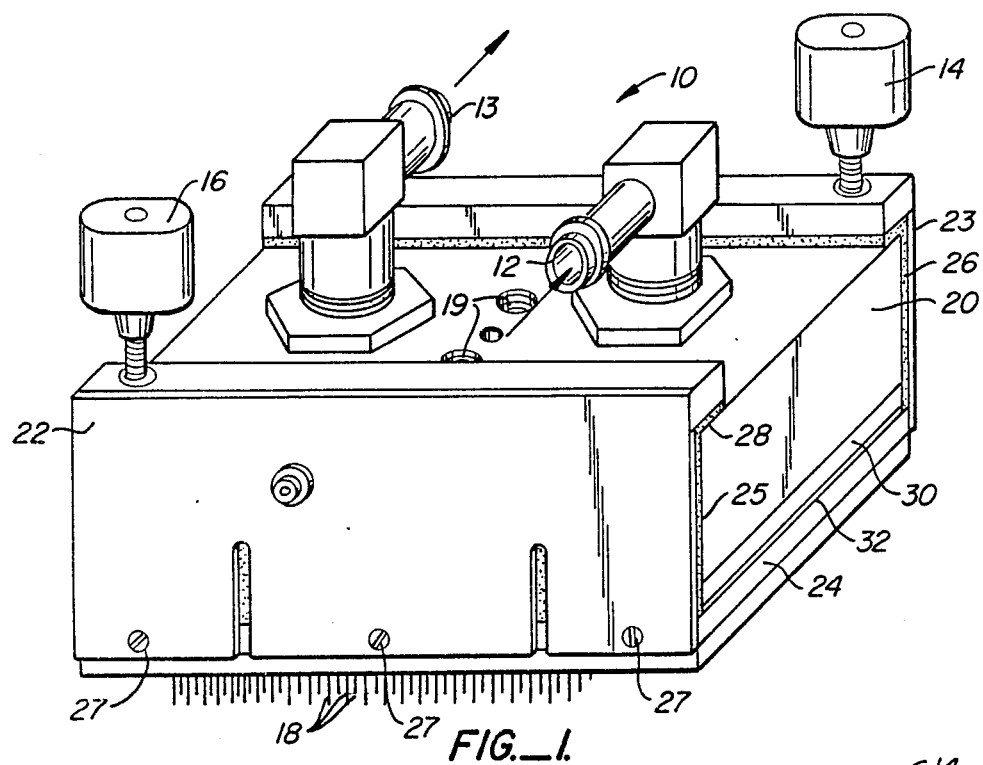
FIG._1.
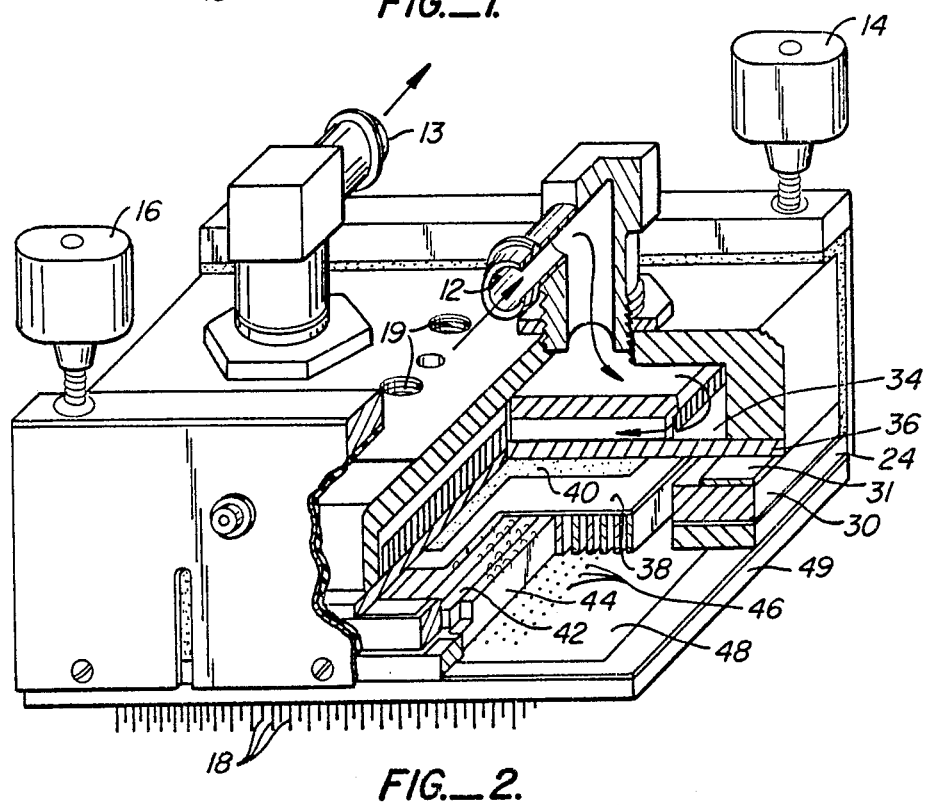
FIG._2.

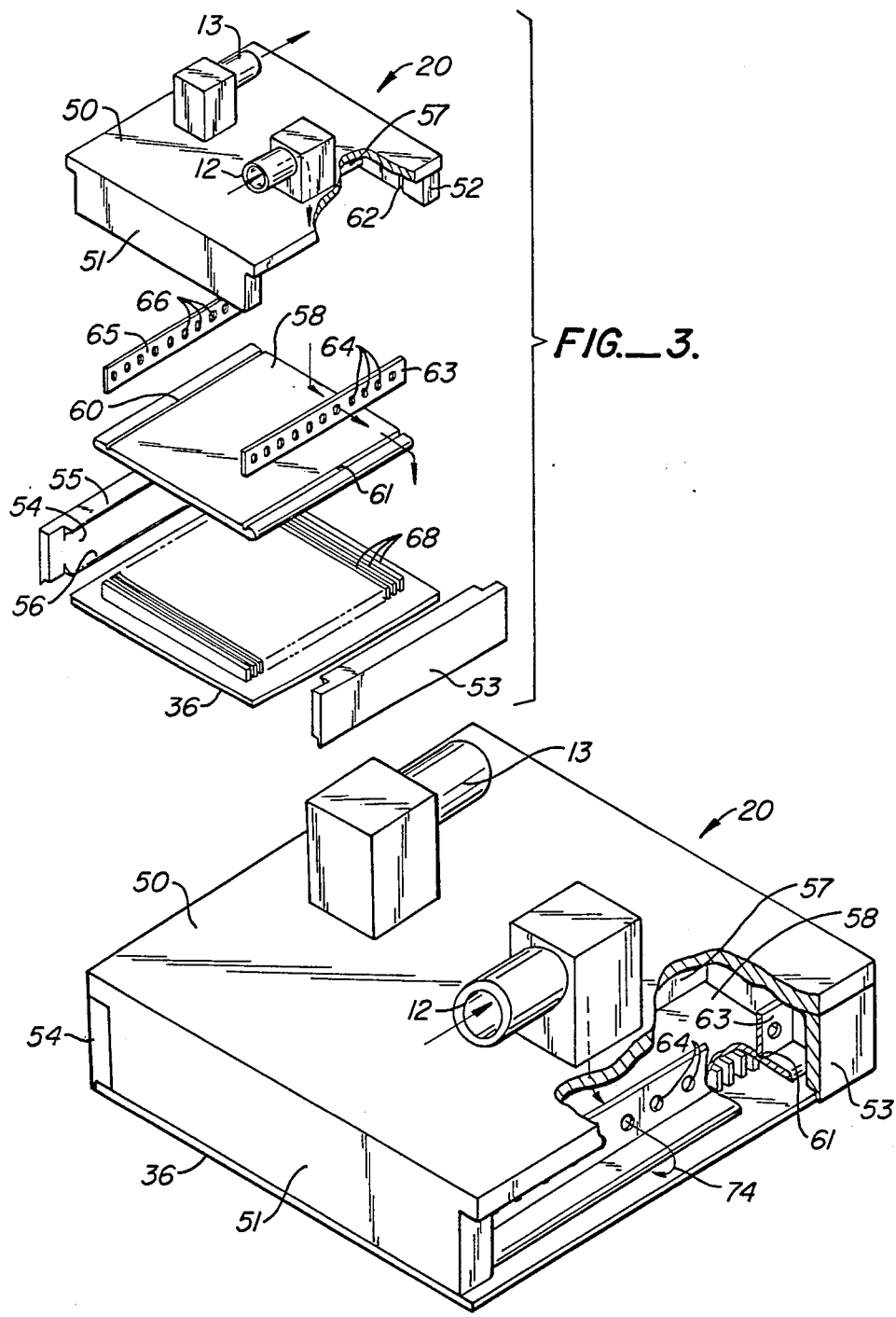
FIG._3.
FIG._4.

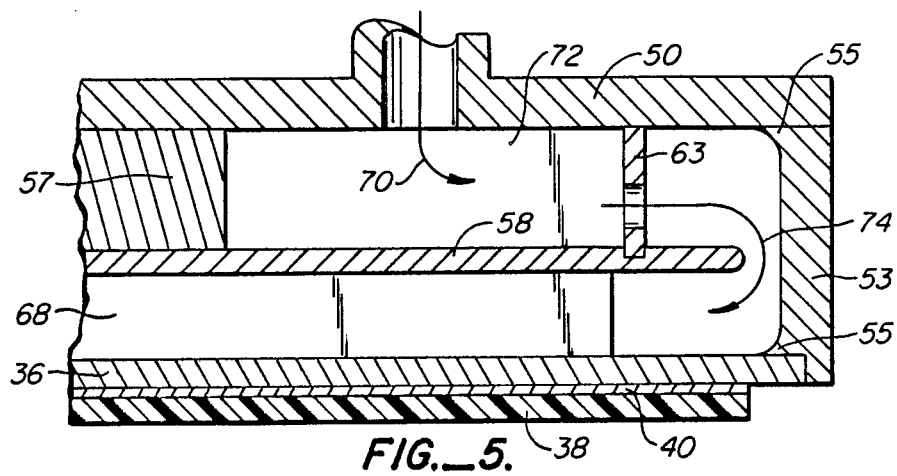
FIG._5.
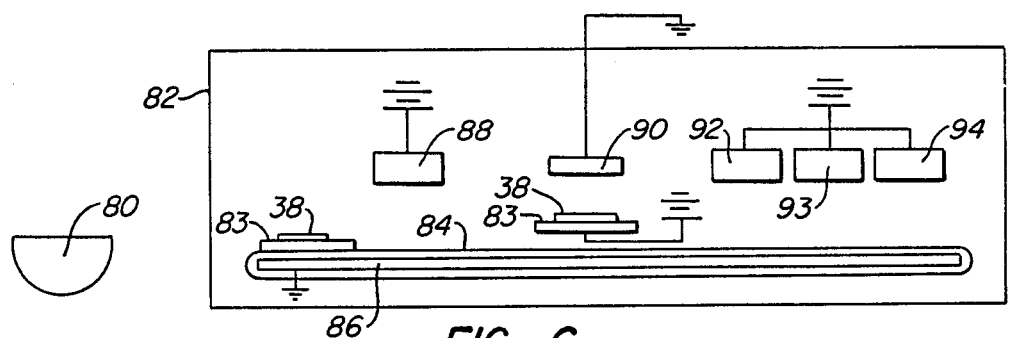
FIG._6.
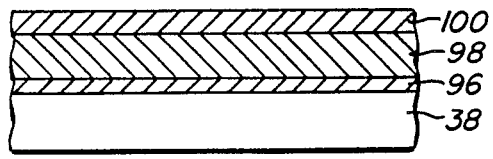
FIG._7A.
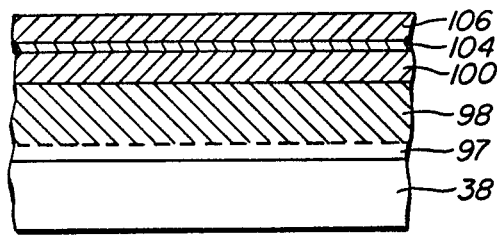
FIG._7B.
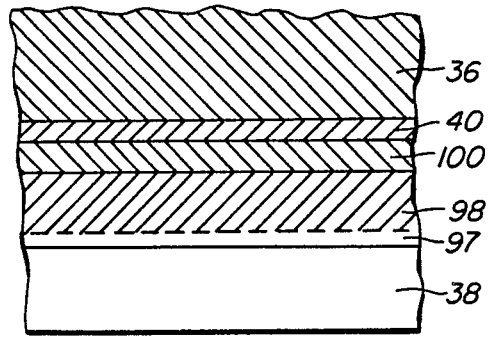
FIG._7C.

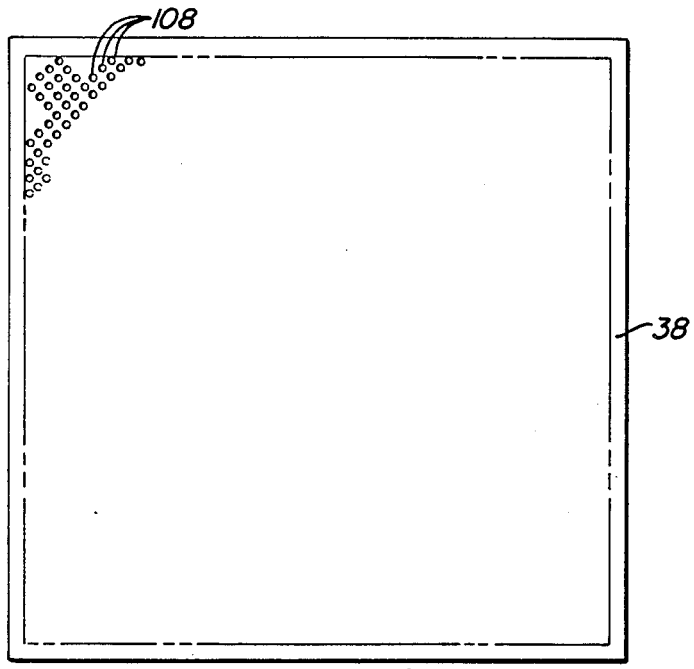
FIG._8A.
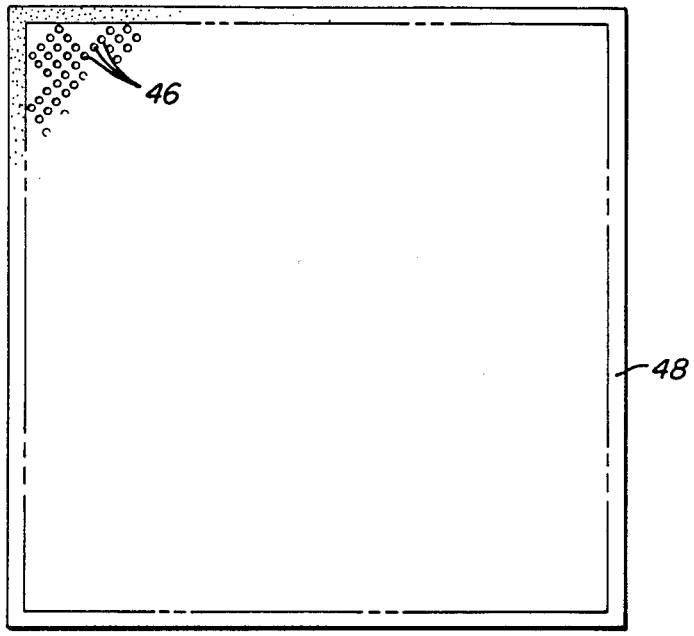
FIG._8B.

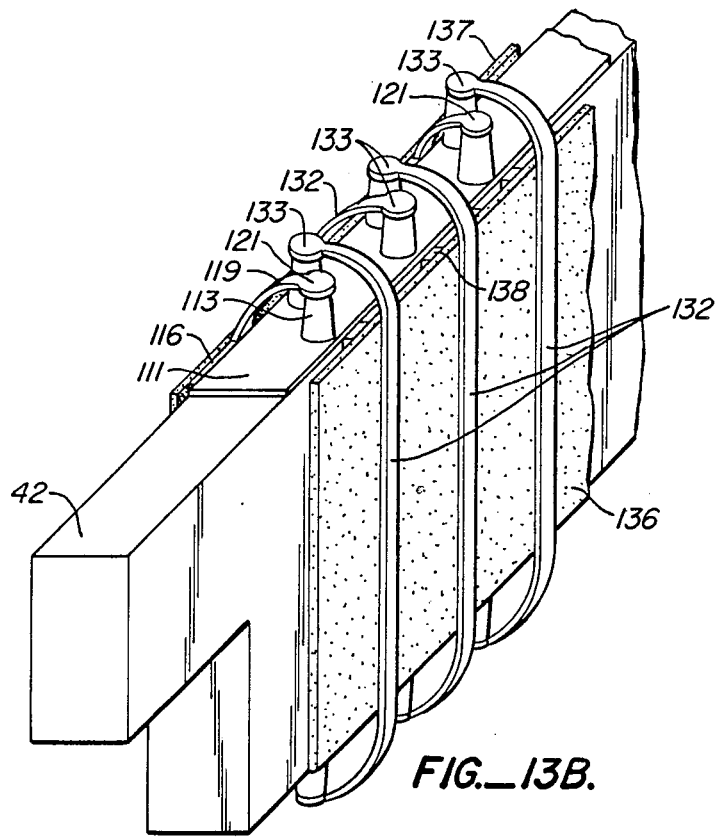
FIG._13B.
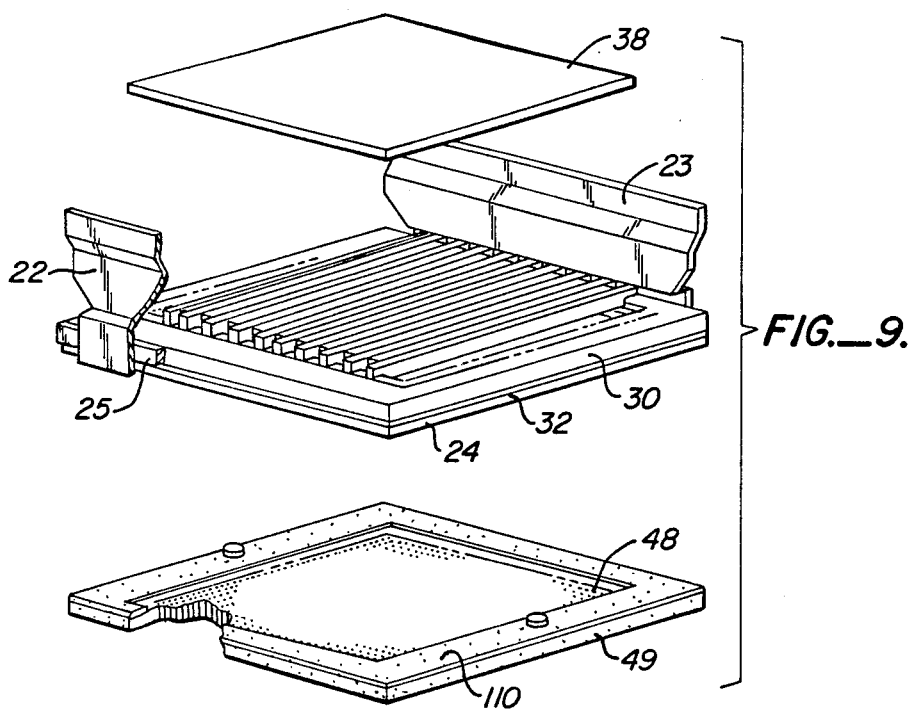
FIG._9.

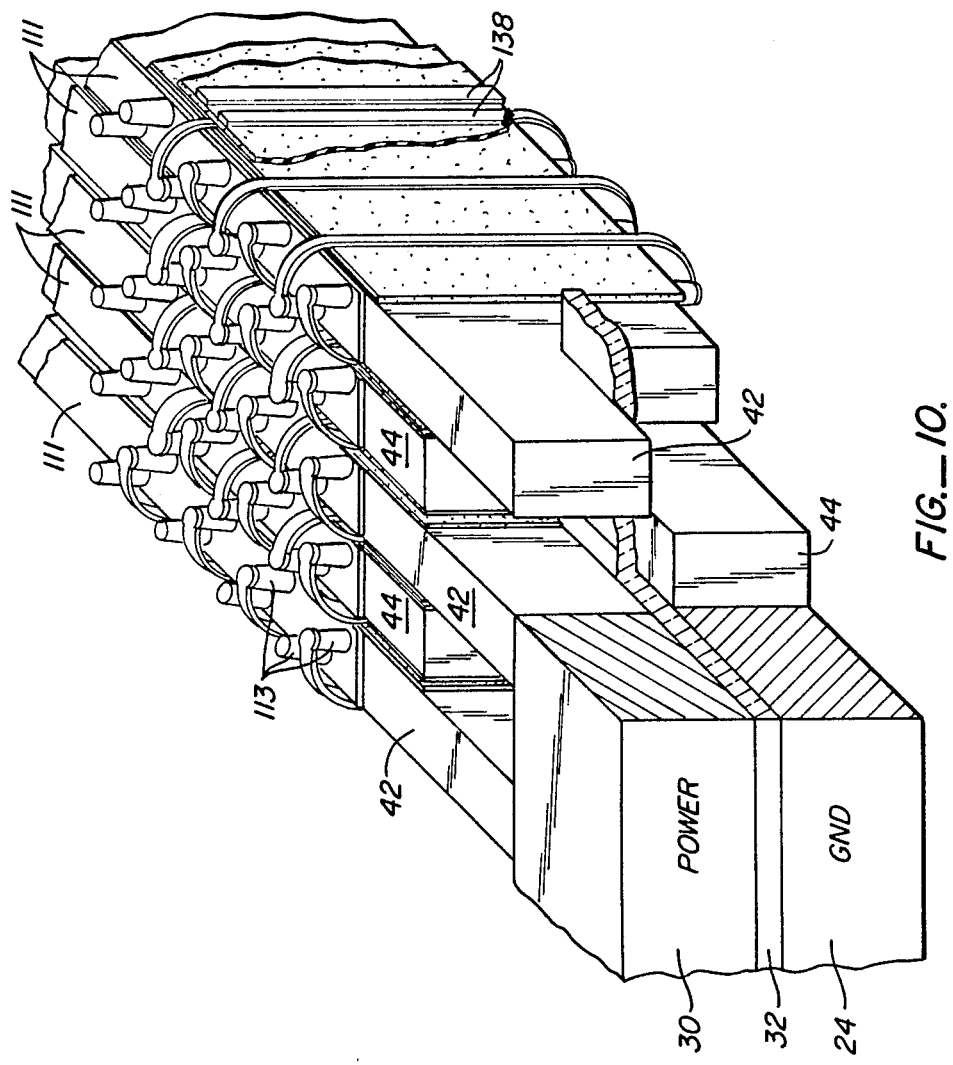
FIG._10.

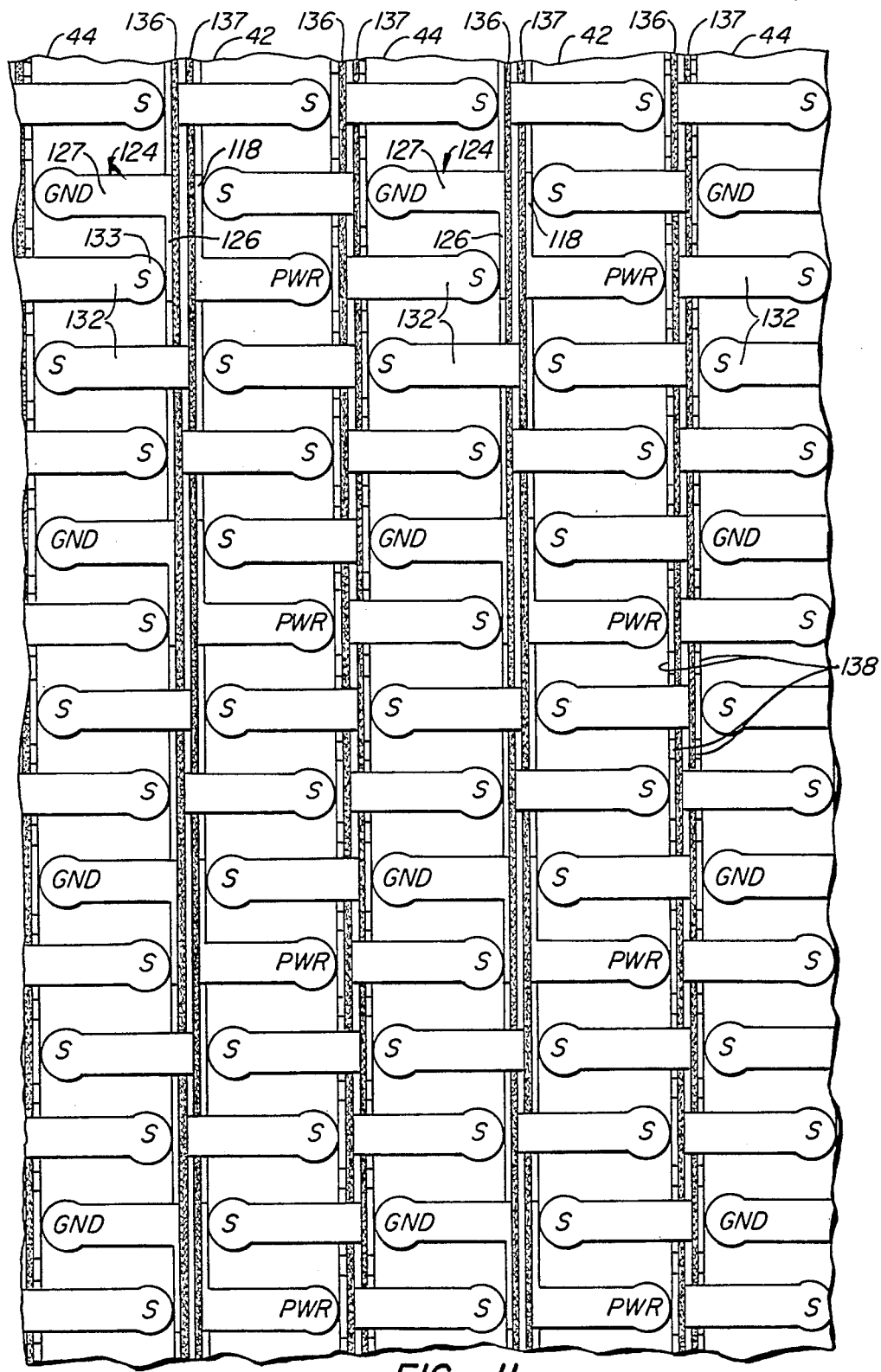
FIG.__11.

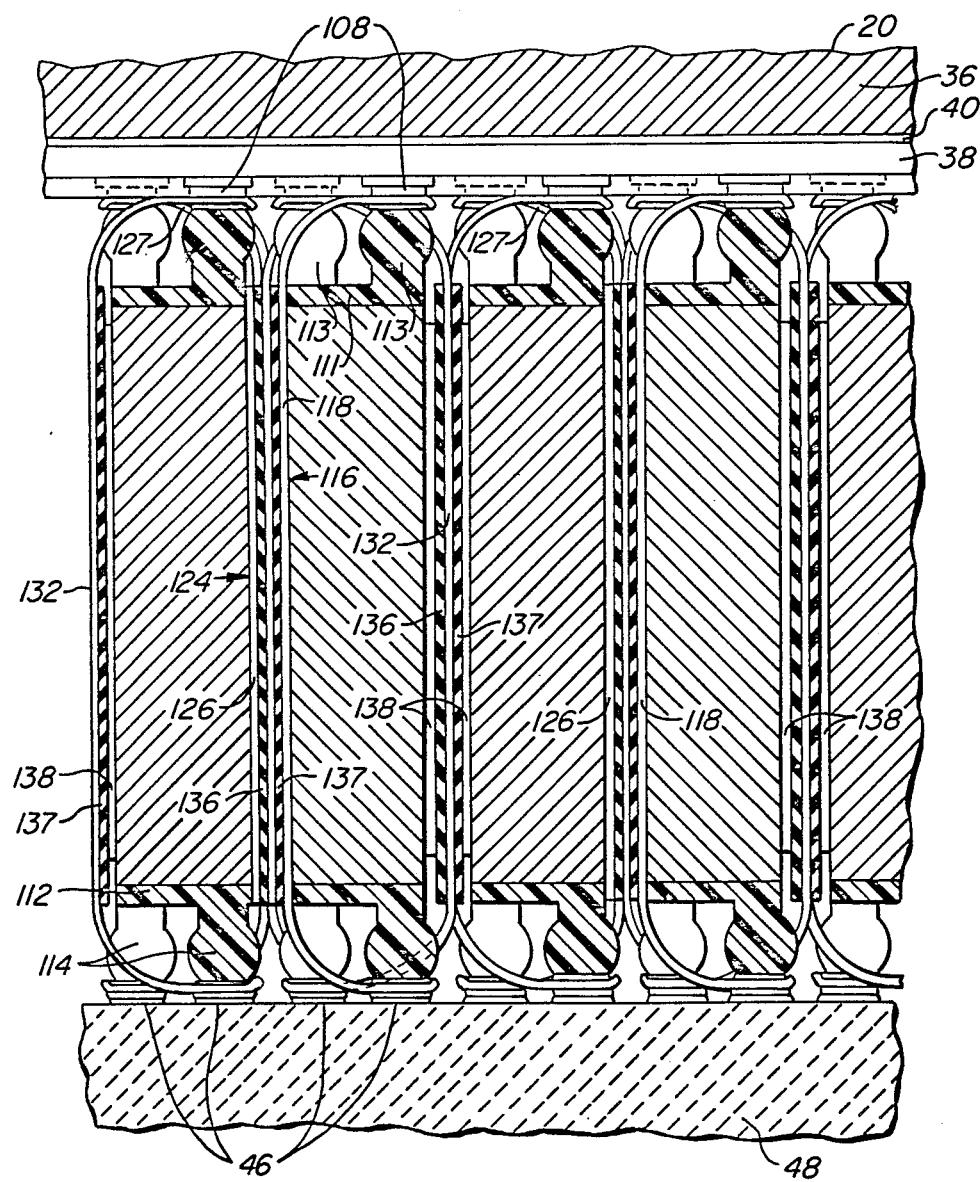
FIG._12.

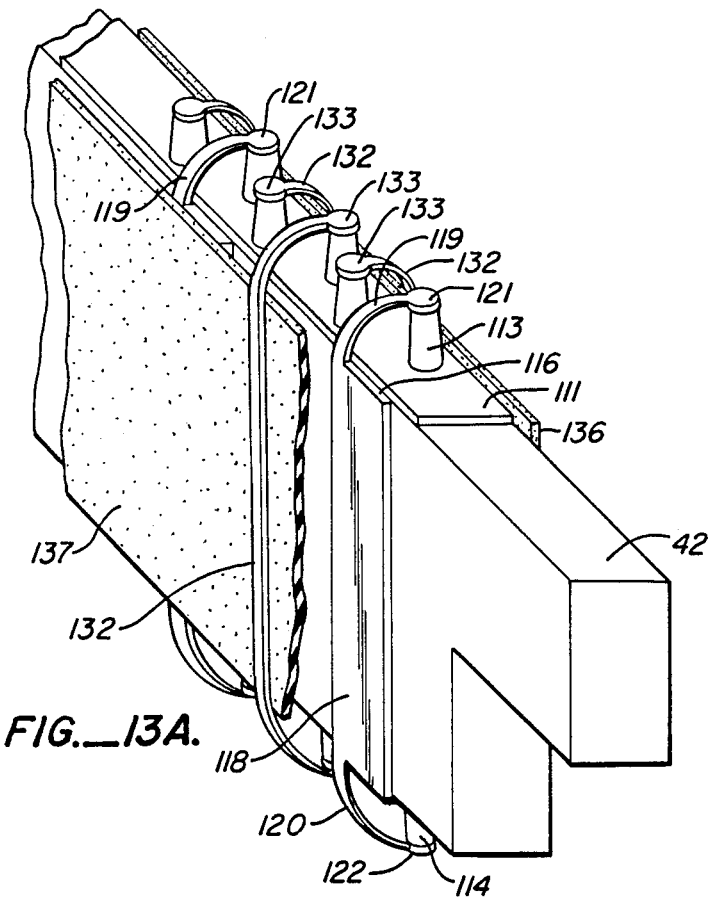
FIG.__13A.
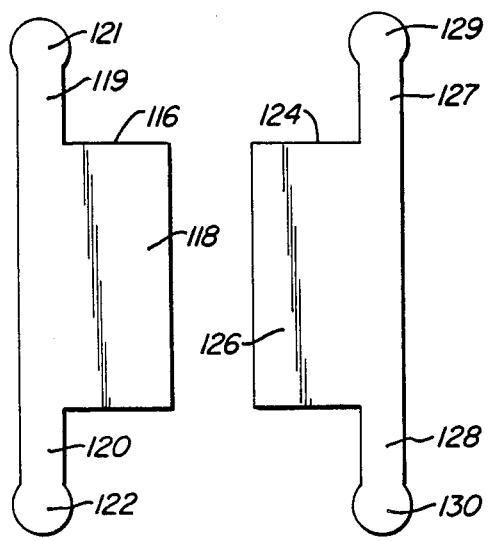
FIG.__14A.  FIG.__14B.
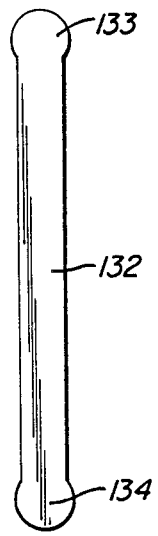
FIG.__14C.

SIGNAL CONNECTION SYSTEM FOR SEMICONDUCTOR CHIP

BACKGROUND OF THE INVENTION

1. Field of the Invention

The present invention relates to a signal connection system for a relatively large semiconductor chip. This invention is to some extent related to an invention described in application Ser. No. 590,651 filed Mar. 19, 1984, and application Ser. No. 590,677 filed Mar. 19, 1984, which is assigned to the assignee of the present invention.

2. Description of the Prior Art

Semiconductor die or "chips" are normally formed in multiples in a silicon wafer, on the order of 5 inches in diameter. The wafer is then cut into individual chips, usually no larger than about 50 square millimeters, which contain a large number of electronic circuit elements. Logic chips which perform arithmetic computation functions, for example the function of addition, are now in production which have more than 40,000 transistors and other circuit elements in a 50 square millimeter area.

One limitation on the size of the chip has been the fact that electrical connections must be made between the various circuits on the chip and other circuits in the system. Typically, chips are rectangular with contacts along their two long edges, or square with contacts along their two long edges, or square with contacts along all four sides, to which the necessary external electrical connections are made. As the size of the chip increases, the number of circuits which can be located on the chip increases much more rapidly than the number of contacts available on its periphery. Attempts have been made to provide a two dimensional array of contacts on one face of the chip, but the difficulty of making pin-point soldered connections between the flat surface of the chip and the flat substrate is itself a limitation on the size of the chip. The number of logic circuits which can be accommodated on a single chip is thus limited by the necessity of connecting the circuits to other system elements, and the chips themselves have been quite small.

SUMMARY OF THE INVENTION

The present invention provides a semiconductor chip module in which the chip has a two-dimensional array of contacts on an exposed face. A mechanism for delivering electricity spans the exposed face of the chip to which it is connected and includes interstitial gaps. A conductor board has a surface proximate the electricity delivering mechanism opposite from the chip. The surface of the board has a two-dimensional array of contacts which correspond to at least some of the contacts on the chip. A biasing mechanism extends from the electricity delivering mechanism toward the exposed face of the semiconductor chip and toward the conductor board, and corresponds to the array of contacts on the chip and board. Signal leads pass through the interstitial gaps and have end portions which extend transversely over the biasing means. The end portions of the signal leads are biased against the contacts of the chips and board by the biasing mechanism.

In the preferred embodiment of the invention, the power and ground leads each comprise a thin, flat strip of conductive material. Each lead has a wide portion fixed to the side of the power or ground bus bar, and the wide portions of the power and ground leads are paired, the leads of each pair being juxtaposed to minimize self-inductance which would degrade the transmission properties of the leads. Each power and ground lead also has a flexible extension bent at an angle of about 90° to the fixed portion of the lead. The flexible extension of each lead is attached to the power or ground contact on the chip and the flexibility of the thin lead and its 90° bend prevent the imposition of any tensile or shear stress on the chip by the lead.

The signal leads comprise flat strips of conductive material including a central portion between adjacent bus bars and end portions beyond the adjacent bus bars. A pair of sheets of electrically insulative material are located between each adjacent power and ground bus bar overlying the power and ground leads. The signal leads pass between adjacent paired sheets of electrically insulative material, and are thereby insulated from the bus bars. The end portions of the signal leads are bent at an angle of about 90° to the central portion and soldered to the chip and ceramic contacts respectively, without imposing mechanical loads on either the chip or the ceramic.

Elastomeric projections emanate from the power and ground bus bars toward both the chip and the multilayer ceramic. The various projections correspond with the contact patters on the chip and ceramic. The elastomeric projections are compressed during construction of the module so that they bias the power, ground and signal contacts against the chip, and the signal contacts (and typically the power and ground contacts also) against the multilayer ceramic. The projections are sufficiently deformable so that a considerable amount of relative movement during assembly and use can be accommodated without imposing undue mechanical loads on the chip.

The ends of the flexible signal leads are soldered to the chip and to the multilayer ceramic, providing a planar array of interconnections without requiring numerous pinpoint soldering connections between flush surfaces, a very difficult task to perform consistently and reliably. The flexible leads provided by the present invention and the elastomeric projections biasing the leads against the chip and ceramic to which the leads are soldered provide for highly reliable connections with an absolute minimum of mechanical strain on the chip, either in use or during fabrication.

The present invention does away with the necessity for using numerous small chips, replacing the functions of several small chips with a single large semiconductor chip. A large scale computer can thus be constructed by using a few large chips rather than numerous smaller ones. The required number of communications from chip to chip is substantially reduced. This results in a dramatic reduction in the length of the average signal transmission path and a correspondingly dramatic increase in overall system speed.

The novel features which are characteristic of the invention, as to organization and method of operation, together with further objects and advantages thereof will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

BRIEF DESCRIPTION OF THE DRAWINGS

FIG. 1 is a perspective view of the preferred embodiment of the module of the present invention;

FIG. 2 is a perspective view of the preferred embodiment of the present invention with portions broken away;

FIG. 3 is an exploded view of the heat sink portion of the preferred embodiment of the present invention;

FIG. 4 is a perspective view of the heat sink portion of the preferred embodiment with portions broken away;

FIG. 5 is a fragmentary plan view of the heat sink portion of the preferred embodiment with the chip attached;

FIG. 6 is a schematic view of the metallizing process used in constructing the preferred embodiment;

FIGS. 7A-C is a sequence of fragmentary plan views illustrating the various steps in preparing the semiconductor chip and attaching it to the heat sink of the preferred embodiment;

FIGS. 8A and B are bottom and top plan views of the chip and multilayer ceramic respectively of the preferred embodiment;

FIG. 9 is an exploded view of the chip, bus bar assembly and multilayer ceramic of the preferred embodiment;

FIG. 10 is a fragmentary perspective view of the bus bars and bus bar frames of the preferred embodiment;

FIG. 11 is a fragmentary plan view of the bus bars and leads of the preferred embodiment;

FIG. 12 is a fragmentary elevation view of the bus bars and leads of the preferred embodiment;

FIGS. 13A and B are perspective views of a single power bus bar from the power and signal sides respectively;

FIGS. 14A-C are elevation views of the power, ground and signal leads of the preferred embodiment before incorporation in the module.

DESCRIPTION OF THE PREFERRED EMBODIMENT

1. General Description

The preferred embodiment 10 of the present invention is illustrated generally by way of reference to FIGS. 1 and 2 in combination. The unit includes a water inlet 12 and a water outlet 13 for liquid cooling of the module. Terminals 14 and 16 are provided for connection to an electrical ground. A plurality of pins 18 emanate from the base of the module, through which signal paths are established to a printed circuit board or other medium and in turn to other elements in the system. A pair of threaded holes 19 are provided for electrical connection to a power source, which also provides a supporting frame to physically mount the module. Other than water connections 12 and 13, ground terminals 14 and 16, pins 18, and power connection 19, the module is essentially self-contained.

A heat sink 20 forms the upper portion of the module. Ground terminals 14 and 16 are directly connected to conducting plates 22, 23 which are electrically insulated from heat sink 20 by sheets 25, 26 of insulative material. Plates 22, 23 are attached directly to a ground bus bar frame 24 by screws 26. A layer 32 of electrically insulating glass material is disposed between ground bus bar frame 24 and power bus bar frame 30. Power, typically at −5 volts is transmitted through heat sink 20 to power bus bar frame 30, which is directly coupled to the heat sink.

Internal to heat sink 20 is a fluid cavity 34 through which the cooling water flows, as best illustrated by FIG. 2. The lower portion of cavity 34 is defined by a plate 36. Directly attached to the lower surface of plate 36 is the semiconductor chip 38 by means of a solder or thermally conductive (e.g., silver loaded) epoxy layer 40. In the preferred embodiment illustrated a single large chip is used, but it is contemplated that the use of several chips in a single module may be desirable in certain applications, all of which would be directly attached to plate 36.

The electrical contacts for chip 38 are formed on the exposed surface of the chip, i.e., the surface away from the attachment surface to plate 36. The exposed surface of chip 38 is the lower surface as the module is depicted in FIG. 2. These contacts include power contacts, ground contacts, and signal contacts in an array, as will be discussed in more detail hereinafter. A plurality of interleaved power bus bars 42 and ground bus bars 44, supported respectively by power bus bar frame 30 and ground bus bar frame 24, traverse the module immediately beneath the exposed face of chip 38. Power and ground connections between the contacts on chip 38 and bus bars 42 and 44 are made by thin flat leads extending from the bus bars to the chip contacts, as will be discussed hereinafter. The signal contacts on the exposed face of chip 38 are connected to corresponding contacts 46 on a connector board, preferably a multilayer ceramic 48, as shown, by thin flat leads passing between the bus bars, as will also be described hereinafter. Electrical connections are provided through multilayer ceramic 48 from the various signal contacts 46 by internal traces terminating in pins 18 for the transmission of signals to and from the chip.

2. Heat Sink

The construction of heat sink 20 is illustrated in more detail by way of reference to FIGS. 3-5. Heat sink 20 includes an upper plate 50 to which the water inlet 12 and water outlet 13 are attached. Other cooling fluids such as Freon, liquid nitrogen or air could be used as appropriate. A pair of side walls 51, 52 form a part of upper plate 50. Other side walls 53, 54 and bottom plate 36 form a fully enclosed structure, and define in part interior cavity 34. End walls 53, 54 have curved ridges such as 55, 56 to form a curved contour at these end walls.

A center plate 58 is located within heat sink 20, and is flush with side walls 51, 52. However, a gap exists between the edges of center plate 58 and end walls 53, 54, leaving a space for the passage of the water. A bulkhead 57 is located between center plate 58 and upper plate 50, inlet 12 and outlet 13 being located on opposite sides of the bulkhead.

Grooves 60, 61 are formed in center plate 58, and corresponding grooves 62 are located in side walls 51, 52. An inlet distributor, comprising a plate 63 with a plurality of holes 64, is located within groove 61 and corresponding grooves 62. A similar outlet distributor, including plate 65 with holes 66, is located in groove 60 and in associated grooves in the side walls. Inlet distributor 63 and outlet distributor 65 completely block the passage between center plate 58 and the top of heat sink 20 so that all fluid must pass through the holes in the distributors.

A plurality of fins 68 are fixed to lower plate 36. Fins 68 are constructed between the end walls 53, 54, and span the space between bottom plate 36 and center plate 58 so that any fluid flowing between end walls 53 and 54 must pass between fins 68.

All of the elements of the preferred embodiment of heat sink 20, and frame 31, are preferably formed of molybdenum. Where fluid contact occurs, the molybdenum is nickel plated. While molybdenum is not an optimum heat conductor, nor is it an optimum electrical conductor, it is adequate in each regard, and has the overriding advantage of having thermal expansion characteristics closely matching those of the semiconductor chip. If differential expansion problems are overcome, better thermal conductors, such as copper, could be used.

Water entering heat sink 20 through inlet 12 is forced outwardly toward end wall 53 by the presence of central bulkhead 57, as illustrated by arrow 70. The volume bounded by upper plate 50, center plate 58, bulkhead 57 and inlet distributor 63 is designated as the inlet plenum 72. The flow restrictions imposed by the holes 64 in distributor 63 increase the pressure in the fluid and distribute the pressure evenly so that the fluid flow through each distributor hole 64 will be approximately equal. Moreover, when the water has passed through the distributor, it must make a 180° turn about the end of center plate 58, assisted by curved ridges 55, as illustrated by arrow 74. This turn also causes a pressure increase in the fluid, assuring equal pressure distribution along the length of end wall 53.

Fins 68 are located on a plane different from that of plenum 72. After the fluid exits the plenum, and makes the 180° turn about the end of center plate 58, it enters the fins. Because of the equalized pressure distribution resulting from the construction of plenum 72 and the 180° turn at the end of center plate 58, fluid flow between each fin 68 will be substantially equal. Moreover, it is contemplated that the flow rates will be limited and that the construction of fin 68 will be such that the flow between the fins is laminar. While laminar flow is less efficient in cooling fin 68 than turbulent flow, the required flow velocity and pressure input is much less, simplifying other design constraints in the system.

After the water leaves fin 68, it makes a similar 180° turn about the other edge of center plate 58, and passes through outlet distributor 65 into an outlet plenum similar to the inlet plenum. This construction, again, assures equalized pressure distribution so that the rate of fluid flow, and its cooling effect, is equal between the respective fins. The construction is also symmetric, so that the flow path can be reversed.

3. Chip Attachment to Heat Sink

In the preferred embodiment 10 of the module of the present invention, single large semiconductor chip 38 is attached to the underside of the lower plate 36 of heat sink 20 by a layer of solder 40, as illustrated in FIG. 5. Other thermally conductive bonding agents, such as silver-loaded epoxy, could also be used. In the preferred embodiment silicon chip 38 is much larger than conventional chips of this type, being on the order of 60 by 60 millimeters. Other smaller chips may be employed if desired. The manner in which the chip is prepared for soldering to heat sink 20 is illustrated by way of reference to FIGS. 6 and 7A-C.

The chip 38 is prepared for soldering by initially etching the backside of the chip in buffered oxide etch (6:1 BOE) bath 80 of ammonium fluoride and hydrofluoric acid, followed by a de-ionized water rinse and dry. Chip 38 is then placed face down on a pallet 83 on conveyor 84 which is grounded at 86 in an inline cathode planar magnetron vacuum sputtering chamber 82. The chip first moves under a substrate heater head 88 to degas the chip and pallet, while maintaining a high vacuum of less than $1 \times 10^{-6}$ Torr. The chip then moves to a grounded radio frequency sputter etch module 90, where chip 38 on pallet 83 is raised from grounded conveyor 84 and RF biased to 1000 V in a low pressure argon gas. About 300 Angstrom of backside silicon and silicon-oxide are etched away, leaving a clean oxide-free silicon backside.

The chip is then passed under metal cathodes 92, 93 which deposit a 1,500 Angstrom layer of gold and a 1,000 Angstrom layer of nickel—7 wt. % vanadium in sequence. The conveyor 84 is then reversed and chip 38 passed back underneath sputtering cathodes 93 and 92, which deposit a 5000 Angstrom layer of nickel—7 wt. % vanadium and a 3,000 Angstrom layer of gold in series. At the end of this process, the backside of chip 38 has the configuration shown in FIG. 7A, with a 1,500 Angstrom layer 96 of gold, a 6,000 Angstrom layer 98 of nickel—7 wt. % vanadium, and a 3,000 Angstrom layer 100 of gold.

The chip is then heat-treated in a nitrogen ambient furnace at 375° C. for 2 hours followed by 350° C. for one hour followed by 375° C. for 20 minutes (these heat treatments may occur as part of subsequent wafer processing). During these heat treatments, the original three-layer system on chip 38, layer 96, 98 and 100, undergo diffusion and intermetallic reactions that provide a low electrical contact resistance to lightly doped p-type (resistivity less than 20 $\Omega$-cm) semiconductor silicon, while also assuring an excellent diffusion bond to the backside silicon. This is accomplished by two significant reactions: (1) the nickel vanadium layer 98 diffuses through the 1,500 Angstrom gold layer 96 to react with the silicon forming a nickel-rich silicide 97, during the 325° C. and 350° C. heat treatments. Gold layer 96 acts as a reaction barrier to limit the amount and thickness of the nickel silicide layer 97 formed, since an excessive silicide layer will be brittle and hence unreliable. (2) During the 375° C. heat treatment, the gold in layer 97 partially reacts to form a gold-silicon eutectic melt at 370° C. This reaction forms a low resistance metal-semiconductor contact as well as a secure bond to the silicon. The result is a combination of the nickel-silicide reaction, limited by the gold layer, and the gold-silicon eutectic reaction, limited by the already formed thin nickel silicide layer.

The 6,000 Angstrom nickel-vanadium layer 98 acts as a barrier layer to prevent silicon diffusion to the top layer 100 of gold, where it would form an undesirable silicon oxide layer. Nickel-vanadium layer 98 also caps the gold-silicon eutectic reaction to hold the eutectic melt in place, preventing the undesirable effect of gold "ball-up" on the silicon, which would be present without a capping layer. During heat treatment a portion of nickel-vanadium layer 98 diffuses into gold layer 100 to convert gold layer 100 into an alloy layer 100 of gold and nickel with traces of vanadium.

After heat treatment, a very thin nickel oxide layer forms on top of layer 100. This layer is removed chemically by dipping in an oxalic acid bath, or removed atomically by radio frequency argon ion sputter etching. A final two layers 104 and 106 are then deposited on chip 38, typically by radio frequency sputter etch in system 82. Without breaking vacuum, which may cause further nickel oxide growth, the chip 38 is passed under metal cathodes 92, 93 which deposit an 800 Angstrom layer of nickel—7 wt. % vanadium 104 and a 3,000 Angstrom layer of gold 106 in series. The chip now has the configuration shown in FIG. 7B and is ready to be soldered to the lower plate 36 of heat sink 20.

A preformed sheet 40 of solder, preferably lead/indium, is used to attach chip 38 to the lower plate 36 of heat sink 20. In the soldering operation, which occurs under vacuum, chip 38 as well as the other elements present are heated. The gold and nickel layers 104, 106 proximate the solder are leached (dissolved) into the solder, and the solder attaches directly to copper layer 102. Gold layer 106 provides an initial oxide-less wetable surface for the molten solder to insure that there are no voids or air pockets in the solder between copper layer 102 on chip 38 and plate 36, a situation which would cause "hot spots" where the liquid cooling would be ineffective and the chip could be damaged. The final configuration of the chip 38 and lower plate 36 includes intervening layer 98 of nickel-vanadium, a portion of which 97 is a nickel-rich silicide and a eutectic melt of gold and silicon, fused to chip 38. Gold-/nickel alloy layer 100, and solder layer 40, which includes the leached gold and nickel-vanadium from former layers 106 and 104, overlie nickel-vanadium layer 98, the solder layer attaching chip 38 and its metallized layers to lower plate 36.

4. Chip/Ceramic Connections

The exposed face of chip 38 is illustrated in FIG. 8A. This exposed face includes a plurality of contacts 108 in a square configuration. The square configuration of contacts 108 is rotated 45° from the square periphery of chip 38. Contacts 108 include the signal contacts for the passage of signals to and from the circuits on the chip, and also power and ground contacts to provide power and ground to the circuits on the chip. As illustrated in FIG. 8B, multilayer ceramic 48 has a corresponding square array of contacts 46, oriented 45° from the periphery of the perimeter of the ceramic. In the preferred embodiment there is an exact correspondence between signal contacts 46 on ceramic 48 and contacts 108 on chip 38, the respective arrays of contacts being mirror images of one another, although in practice the power and ground contacts on the ceramic may not be utilized. As is known in the art, ceramic 48 includes internal electrical vias or traces joining the various signal contacts 46 with external pins 18 (see FIG. 2).

The relationship of semiconductor chip 38, multilayer ceramic 48, and the intervening elements, is illustrated in FIG. 9. Power bus bar frame 30 and ground bus bar frame 24, separated by insulating bonding layer 32, lie above the frame 49 for ceramic 48. An insulating bonding layer 110 electrically isolates ceramic frame 49 from ground bus bar frame 24. The combination of heat sink 20, frames 30 and 24 and 49, and insulating layers 32 and 110, provide a hermetically sealed chamber in which the chip/ceramic connections are made.

Alternating power bus bars 42 and ground bus bars 44 are supported by power bus bar frame 30 and ground bus bar frame 24 respectively. While discrete bars are preferred, machined or apertured plates could be used also for power and ground respectively. The electrical connections are made through heat sink 20 for the power bus bars and for the ground bus bars through plates 22, 23. The lower surface of chip 38, and the upper surface of multilayer ceramic 48, are both closely proximate the power and ground bus bars, but a slight spacing is left between each of the faces and the bus bars.

The manner in which signal connections are made between chip 38 and ceramic 48 is illustrated by way of reference to FIGS. 10-13A, B in combination. Each bus bar 42, 44 has layers 111, 112 of silicon rubber molded directly to its upper and lower surfaces respectively. Each layer 111, 112 includes a plurality of bumps 113, 114 molded in the silicone rubber, the bumps being elastic and resilient.

Electrical connections are made to and around the bus bars by means of three types of leads, illustrated individually in FIGS. 14A-C. The leads are formed of highly electrically conductive material, typically copper. FIG. 14A depicts a power lead 116, comprising a flat strip of conductive material such as copper. Lead 116 includes an enlarged central portion 118 and narrow end portions 119, 120, emanating from the left edge of central portion 118 as shown in FIG. 14A. The tips 121, 122 of end portions 119, 120 are rounded.

A ground lead 124 is illustrated in FIG. 14B, and is essentially a mirror-image of the power lead. Ground lead 124 is a flat strip of material, with a wide central portion 126, narrow end portions 127, 128 emanating from the right edge of central portion 126 (as shown in FIG. 14B), and rounded tips 129, 130. Signal conductor 132 is illustrated in FIG. 14C, and comprises a long narrow flat strip of electrically conductive material, such as copper, with rounded ends 133, 134.

Referring specifically to FIG. 13A, each power lead 116 is attached to a power bus bar 42. The large central portion 118 is fixed (welded, soldered etc.) directly to the side of power bus bar 42. Flexible upper end 119 is bent approximately 90° so that the round tip 121 lies flush on top of a resilient bump 113 at the far side of the bus bar. Correspondingly, lower end 120 is also bent 90° so tip 122 lies flush on top of bump 114. Power leads 116 are attached along one side only of each power bus bar 42, and occupy every fourth bump 113 along the top of the bus bar. Since the bumps are arranged in two rows, power leads 116 occupy every other bump along the right row of bumps, as illustrated in FIG. 13A.

Ground leads 124 are attached along one side of each ground bus bar 44. As illustrated in FIGS. 11 and 12 the enlarged central portion 126 of each ground lead 124 is fixed directly to the side of the ground bus bar 44, so that the central portion 126 of the ground lead and the central portion 118 of a power lead 116 are juxtaposed back to back. The upper ends 127 of each ground lead are bent 90° so that the round tip 129 is flush upon a bump 113. Lower ends 128, are similarly bent so that the rounded tips 130 are flush on top of bumps 114.

A pair of sheets 136, 137 of electrically insulative material, typically Kapton, are disposed between each adjacent power bus bar 42 and ground bus bar 44. Sheets 136 and 137 overlie the central portions 118, 126 of power leads 116 and ground leads 124, and the central portions of these leads serve to space sheets 136, 137 from the bus bars themselves. On the sides of the bars where there are no power and ground leads, spacers 138 are provided for this purpose.

Signal leads 132 pass between adjacent sheets 136, 137 of insulative material. The central portions of signal leads 132 are straight, and the ends are bent approximately 90° so that the rounded tips 133, 134 are flush on top of bumps 113, 114 respectively. Accordingly, the signal leads are insulated from both power bus bar 44 and ground bus bar 42. In FIG. 11, the signal leads are designated "S", the ground leads "GND", and the power leads "PWR", for convenient reference.

When the module assembly is joined together, the upper ends of each power, ground and signal lead are pressed against and soldered to an adjacent contact 108 on chip 38, as illustrated in FIG. 12. The dimensions are such that each resilient bump 113 is compressed, typically approximately 20%, to provide a biasing force pressing the lead against the contact. Similarly, bumps 114 are compressed to bias the lower ends of the leads against the contacts 46 on ceramic 48, to which the leads are soldered. The ends of the leads are completely flexible, and the bumps are elastic, to accommodate relative movement during differential heat expansion and the like. As a result, extremely reliable soldered connections are made between the numerous contacts on the chip and on the ceramic.

5. Module Operation

Assembled module 10 is cooled by water flowing through heat sink 20. Other cooling fluids could be used as well. The construction of heat sink 20 is such that uniform cooling is provided to all parts of the chip. Chip 38 is soldered directly to the lower plate 36 of heat sink 20 so that the cooling action is efficient, and the heat sink provides an electrical ground to the chip as well.

Electrical connections are made between the chip 38 and multilayer ceramic 48 by means of signal contacts which are isolated from power and ground bus bars 42, 44 between the chip and ceramic. Power and ground leads 118, 126 connect the respective bus bars to the chip. Power leads 118 and ground leads 126 are also connected to the ceramic for convenience of assembly, but the connections between the bus bars and the ceramic need not be functional. Electrical signals are passed to and from the chip by external pins 18, which communicate through multilayer ceramic 48 and the signal leads to chip 38.

While a preferred embodiment of the present invention has been illustrated in detail, it is apparent that modifications and adaptations of that embodiment will occur to those skilled in the art. However, it is to be expressly understood that such modifications and adaptations are within the spirit and scope of the present invention, as set forth in the following claims.

What is claimed is:

1. A semiconductor chip module comprising:
a semiconductor chip having a two dimensional array of contacts on an exposed face;
electricity delivering means including both power and ground portions spanning the exposed face of the chip and including interstitial gaps between said power and ground portions;
means coupling the electricity delivering means to the chip;
a conductor board having a surface proximate the electricity delivering means opposite from the chip, said surface having a two-dimensional array of contacts which correspond to at least some of the contacts on the chip;
biasing means extending from the electricity delivering means toward the exposed face of the semiconductor chip and toward the conductor board, said biasing means corresponding to the arrays of contacts on the chip and board; and
signal leads passing through the interstitial gaps in the electricity delivery means and having end portions extending transversely over the biasing means and biased against the contacts of the chip and board by said biasing means.

2. The module of claim 1 wherein the power and ground portions of electricity delivery means comprise a plurality of interleaved power and ground bus bars arranged alternately and spanning the exposed face of the chip, said power and ground bus bars being spaced-apart from each other to provide said interstitial gaps.

3. The module of claim 2 and additionally comprising a pair of sheets of electrically insulative material located in the gaps between each adjacent power and ground bus bar, the signal leads passing between the pair of sheets of electrically insulative material.

4. The module of claim 3 wherein the signal leads comprise strips of conductive material which include a central portion in the gaps between the bus bars and end portions beyond the bus bars bent at an angle of about 90° to the central portion to attach to the chip and board contacts respectively.

5. The module of claim 1 wherein certain of the contacts on the chip are ground and signal contacts, and wherein the coupling means comprises power and ground leads having a portion fixed to the respective bus bars and one end extending transversely over the biasing means and biased against the power and ground contacts by the biasing means.

6. The module of claim 1 wherein the biasing means comprise elastomeric projections.

7. The module of claim 6 wherein the elastomeric projections are constructed of silicone rubber.

8. A semiconductor chip module comprising:
a semiconductor chip having a two dimensional array of power, ground and signal contacts on an exposed face;
a plurality of power bus bars spanning the exposed face of the chip;
a plurality of ground bus bars spanning the exposed face of the chip interleaved with and spaced-apart from the power bus bars;
power leads attached to the power bus bars and extending to adjacent power contacts on the chip;
ground leads attached to the ground bus bars and extending to adjacent ground contacts on the chip;
a conductor board having a surface proximate the power and ground bus bars opposite from the chip, said surface having an array of contacts which correspond to at least the signal contacts on the chip;
signal leads passing between adjacent power and ground bus bars and extending between signal contacts on the chip and corresponding signal contacts on the board; and
means biasing the power, ground and signal leads against the contacts on the chip and conductor board.

9. The module of claim 8 wherein the signal leads comprise strips of conductive material which include a central portion between adjacent bus bars and end portions beyond the bus bars bent at an angle of about 90° to the central portion for soldering to the chip and board contacts respectively.

10. The module of claim 8 and additionally comprising pairs of sheets of electrically insulative material located between adjacent power and ground bus bars, each signal lead passing between one of the pairs of sheets of electrically insulative material.

11. The module of claim 8 wherein the biasing means comprises elastomeric projections.

12. The module of claim 11 wherein the elastomeric projections are constructed of silicone rubber.

13. The module of claim 8 wherein the power and ground leads each comprise a thin, flat strip of conductive material fixed to sides of the respective power and ground bus bars and having a flexible extension bent at an angle of about 90° to the fixed portion of the lead for soldering to the power and ground contacts respectively on the chip.

14. The module of claim 13 wherein the portions of the power and ground leads fixed to the power and ground bus bars respectively are wide relative to the flexible extension.

15. The module of claim 14 wherein the power and ground leads are paired, and each pair of power and ground leads are closely juxtaposed.

16. A semiconductor module comprising:
   a semiconductor chip with electronic circuits formed therein having a two-dimensional array of power, ground and signal contacts on an exposed face;
   a plurality of interleaved power and ground bus bars spanning the exposed face of the chip, which power and ground bus bars are spaced-apart to provide interstitial gaps;
   a conductor board having a surface proximate the power and ground bus bars opposite from the chip, said surface having a two-dimensional array of contacts which correspond to at least the signal contacts of the chip;
   a plurality of elastomeric projections extending between the power and ground bus bars and the chips and between the power and ground bus bars and the conductor board, the elastomeric projections corresponding to the contact array on the chip and the contact array on the conductor board;
   power and ground leads emanating from the power and ground bus bars respectively and having flexible end portions biased against the power and ground contacts by certain of the elastomeric projections; and
   a plurality of signal leads having central portions passing between adjacent power and ground bus bars and having end portions bent at 90° angles to the center portions and biased against the signal contacts on the chip and conductor board by other of the elastomeric projections.

17. The module of claim 16 wherein the leads are constructed of copper.

18. The module of claim 16 and additionally comprising a pair of sheets of electrically insulative material located in the gap between each adjacent power and ground bus bar, the signal leads passing between the paired sheets of electrically insulative material.

19. The module of claim 16 wherein the power and ground leads each comprise a thin, flat strip of conductive material fixed to sides of the respective power and ground bus bars and having a flexible extension bent at an angle of about 90° to the fixed portion of the lead for soldering to the power and ground contacts respectively on the chip.

20. The module of claim 19 wherein the portions of the power and ground leads fixed to the power and ground bus bars respectively are wide relative to the flexible extension.

21. The module of claim 20 wherein the power and ground leads are paired, and each pair of power and ground leads are closely juxtaposed.

22. The module of claim 16 wherein the signal leads are thin, flat strips of copper.

* * * * *